United States Patent [19]

Traub

[11] Patent Number: 4,528,499
[45] Date of Patent: Jul. 9, 1985

[54] MODIFIED BRIDGE CIRCUIT FOR MEASUREMENT PURPOSES

[75] Inventor: Stefan Traub, Boblingen, Fed. Rep. of Germany

[73] Assignee: Hewlett-Packard GmbH, Palo Alto, Calif.

[21] Appl. No.: 433,226

[22] Filed: Oct. 7, 1982

[30] Foreign Application Priority Data

Oct. 24, 1981 [DE] Fed. Rep. of Germany ....... 3142325

[51] Int. Cl.$^3$ ............................................ G01R 27/02
[52] U.S. Cl. ................................. 324/62; 324/DIG. 1
[58] Field of Search ............ 324/57 R, DIG. 1, 62 R

[56] References Cited

U.S. PATENT DOCUMENTS

| | | | |
|---|---|---|---|
| 3,908,164 | 9/1975 | Parker | 324/DIG. 1 |
| 4,205,556 | 6/1980 | Runyan | 324/DIG. 1 |
| 4,229,692 | 10/1980 | Graeme | 324/62 |

FOREIGN PATENT DOCUMENTS

| | | | |
|---|---|---|---|
| 1473596 | 1/1971 | Fed. Rep. of Germany . | |
| 108466 | 6/1983 | Japan | 324/57 R |
| 2068130 | 8/1981 | United Kingdom . | |

OTHER PUBLICATIONS

Carius, Von W. "Multichannel Temperature Measuring Device with Linearization for Pt 100-Resistance Thermometers", Technisches Messen, vol. 48, Apr. 1981, Nr. 4, pp. 127 through 130.

Cutkosky, R. D. and Davis, R. S., "Simple Control Circuit for Temperature Regulation and Other Bridge Applications", 8127 Review of Scientific Instruments, vol. 52(1981), Sep. 9, pp. 1403–1405.

*Primary Examiner*—Stanley T. Krawczewicz
*Assistant Examiner*—Jose M. Solis
*Attorney, Agent, or Firm*—Jeffery B. Fromm

[57] ABSTRACT

In a four element modified bridge circuit for measurement purposes at least one impedance element is variable according to a magnitude to be measured. Via a first operational amplifier a DC supply voltage is connected across two bridge nodes facing each other, and at the other two nodes facing each other an output signal is delivered corresponding to the magnitude to be measured. By means of a second operational amplifier one of the output nodes is virtually drawn to ground so that the signal at the second output bridge node is referenced to ground. Thus, the signal at the second output node corresponds to the desired measured magnitude without a superimposed power supply voltage and may be amplified by a third standard operational amplifier without the need of a differential amplifier circuit.

2 Claims, 1 Drawing Figure

MODIFIED BRIDGE CIRCUIT FOR MEASUREMENT PURPOSES

BACKGROUND OF THE INVENTION

Bridge circuits for measurement purposes typically comprise four impedance elements, at least one of which is a sensor element, e.g., a strain gauge for length measurements or a thermistor for temperature measurements. Such a bridge circuit is advantageous in that extremely small impedance variations of the sensor element can be readily detected. The bridge circuit can be supplied with relatively high voltages and currents, respectively. The output signal corresponding to the measured magnitude, however, is a voltage or current corresponding only to the impedance variation of the sensor element but not to the absolute impedance thereof. Thus, the output signal does not contain the relatively high voltage or current which is impressed across the bridge circuit at the sensor element.

Unfortunately such bridge circuits have no common reference potential between the supply voltage or supply current on the one hand and output voltage or output current on the other hand and thus galvanic isolation is necessary between the power supply and output signal processing circuit.

It is well known that in order to avoid the need for such galvanic isolation the bridge output signal can be coupled to a differential amplifier. The output signal of this differential amplifier is then referred to the common ground of the circuit. However, such differential amplifiers must have high common mode rejection in order to achieve a precise measurement of the differential bridge output signal which is usually small as compared to the supply voltage or supply current. For practically realizing such differential amplifiers precision components are usually required, often requiring pairs of precision resistors to achieve a desired common mode rejection of, for example, 60–80 decibels. However, even precision components are temperature dependent. This temperature dependency can be compensated only with additional expensive circuits or temperature compensated resistors.

British Pat. No. 2,068,130 discloses a bridge circuit for measuring purposes one node of which is drawn to virtual ground by means of an operational amplifier. This bridge circuit is included in an oscillator in which the frequency varies with the variation of the sensor impedance in at least one branch of the bridge. Thus, this circuit is not suitable for applications where a DC output signal is required.

SUMMARY OF THE INVENTION

According to the preferred embodiment of the present invention there is provided a modified bridge circuit for measurement purposes comprising four impedance elements with at least one impedance element being variable according to a magnitude to be measured. Four nodes are thus provided, each node being located at a different connection of two of the impedance elements, a first pair of the nodes facing each other serving as a power input and the other pair of the nodes facing each other serving as a signal output. A voltage supply supplies via a first operational amplifier a DC voltage to the first pair of power nodes. A second operational amplifier is connected to one of the second pair of signal nodes for drawing the potential of that one signal node to a virtual ground.

The bridge circuit according to the invention does not require galvanic isolation or a differential amplifier with high common mode rejection. It requires only a few relatively inexpensive components and does not deliver at its output a signal coming from the power supply superimposed on the desired differential signal. The output signal may then be non-reactively amplified relative to a ground referenced power signal by means of a further operational amplifier.

DESCRIPTION OF THE PREFERRED EMBODIMENT

Figure 1:
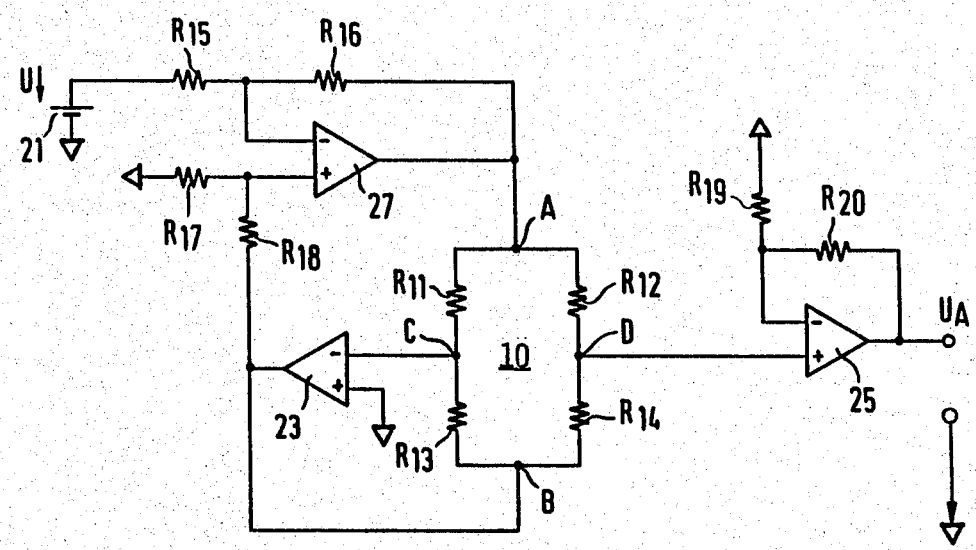
FIG. 1 is a schematic diagram of the Preferred Embodiment of the present invention.

In FIG. 1 reference numeral 10 designates a resistor bridge circuit having four resistors $R_{11}$, $R_{12}$, $R_{13}$ and $R_{14}$. The four nodes of the bridge are labelled A, B, C and D. Node B is connected to the output of an operational amplifier 23, the negative input of which is connected directly to node C and the positive input of which is connected to ground. The purpose of amplifier 23 is to draw node C virtually to ground, independent of both the voltage between nodes A and B and from the imbalance of the bridge 10.

At node D opposite node C the measurement signal is produced which is referred to ground since node C is at a virtual ground. The measurement signal at node D may be amplified by means of a simple DC voltage amplifier 25 which forms a non-inverting amplifier along with resistors $R_{19}$ and $R_{20}$. The output voltage $U_A$ of amplifier 25 is proportional to the voltage across nodes D and C and is referred to ground. The output voltage $U_A$ can then be delivered to a suitable output or display device.

At least one of resistors $R_{11}$, $R_{12}$, $R_{13}$ and $R_{14}$ is a sensor element, e.g., a strain gauge or a thermistor, the resistance of which is variable corresponding to the magnitude to be measured.

A constant voltage is supplied across nodes A and B. A DC voltage source 21 having the constant voltage U is connected to the negative input of an operational amplifier 27 via a resistor $R_{15}$ and to node A via resistor $R_{15}$ and a further resistor $R_{16}$. The positive input of operational amplifier 27 is connected to ground via a resistor $R_{17}$ and to node B via a resistor $R_{18}$. Assuming that $R_{15}=R_{17}$ and $R_{16}=R_{18}$, then the voltage across nodes A and B is $$U_{AB} = -U\frac{R_{16}}{R_{15}} \quad (1)$$

Using the well-known equations for a resistor bridge circuit, the voltage at node D is thus $$U_D = -U_{AB}\left(\frac{R_{12}}{R_{12}+R_{14}} - \frac{R_{11}}{R_{11}+R_{13}}\right) \quad (2)$$

I claim:
1. A bridge circuit for measuring purposes including at least one impedance element which is variable in accordance with an entity to be measured,
    a voltage applied to a first bridge diagonal, a signal corresponding to the measured entity derived at a second bridge diagonal, and a first junction of the second bridge diagonal being virtually connected to ground by means of an operational amplifier, said bridge circuit comprising in combination:

an inverting input of a second operational amplifier connected via a first resistor to a first terminal of a d.c. source, and connected via a second resistor to the output of the second operational amplifier, as well as with a first junction of the first bridge diagonal;

a non-inverting input of the second operational amplifier connected via a third resistor to a second terminal of the d.c. source, and via a fourth resistor to a second junction of the first bridge diagonal; and the second terminal of the d.c. source connected to ground.

2. A bridge circuit as in claim 1, further comprising a second junction of the second bridge diagonal connected to an input of a d.c. amplifier, and said d.c. amplifier having an output, which provides an output voltage referenced to ground potential, said output voltage being proportional to the signal in the second bridge diagonal.

* * * * *